United States Patent [19]
Duffy

[11] 3,955,160
[45] May 4, 1976

[54] SURFACE ACOUSTIC WAVE DEVICE

[75] Inventor: Michael Thomas Duffy, Princeton Junction, N.J.

[73] Assignee: RCA Corporation, New York, N.Y.

[22] Filed: Apr. 30, 1975

[21] Appl. No.: 573,388

[52] U.S. Cl. .............................. 333/30 R; 310/8.2; 310/9.5; 310/9.8; 333/72
[51] Int. Cl.² ...................... H03H 9/26; H03H 9/30; H03H 9/32; H01L 41/18
[58] Field of Search ............... 333/30 R, 72; 29/583; 252/62.9 R; 310/8, 8.1, 9.5, 8.2, 9.8; 357/17, 40, 49, 80, 91

[56] References Cited
UNITED STATES PATENTS

| | | | |
|---|---|---|---|
| 3,122,662 | 2/1964 | Mason | 252/62.9 R |
| 3,786,373 | 1/1974 | Schulz et al. | 333/30 R |
| 3,816,906 | 6/1974 | Falckenberg | 29/583 |
| 3,828,283 | 8/1974 | Daniel | 333/30 R |
| 3,849,707 | 11/1974 | Braslau et al. | 357/17 |

OTHER PUBLICATIONS

Bruun et al—"Field Effect Transistors on Epitaxial GaAs as Transducers for Acoustic Surface Waves" in Applied Physics Letters, Feb. 15, 1971; pp. 118–120.
Maruska et al—"The Preparation and Properties of Vapor-Deposited Single-Crystalline GaN" in Applied Physics Letters, Nov. 15, 1969; pp. 327–329.
Mason—Physical Acoustics, Vol. VII, Academic Press, 1970, pp. 229–232 and Title Page.
Reeder et al—IEEE Trans. on Microwave Theory and Techniques, Vol. mtt–17 Nov. 17, 1969; pp. 936–938.

Primary Examiner—Alfred E. Smith
Assistant Examiner—Marvin Nussbaum
Attorney, Agent, or Firm—Glenn H. Bruestle; Arthur E. Wilfond; Ronald L. Yin

[57] ABSTRACT

An insulating substrate, on which is at least one single crystalline electrode and a single crystalline layer of piezoelectric material on the electrode, forms an efficient surface acoustic wave device.

7 Claims, 6 Drawing Figures

SURFACE ACOUSTIC WAVE DEVICE

BACKGROUND TO INVENTION

The invention described herein was made in the course of or under a contract or subcontract with the Department of the Air Force.

The present invention relates to a surface acoustic wave device, and more particularly to a surface acoustic wave device constructed from an insulating substrate on which is at least one single crystalline electrode and a single crystalline layer of piezoelectric material on the electrode.

Until recently, surface acoustic wave devices have been constructed from piezoelectric films on which are pairs of metal electrodes shaped in interdigital grating patterns. Electrical excitation of the electrodes causes acoustic stresses in the piezoelectric film, thereby exciting surface waves in the film. These surface acoustic waves are then converted into electrical signals by a second pair of electrodes also shaped in an interdigital grating pattern. In "Theory of Interdigital Couplers on Non-piezoelectric Substrates" by G. S. Kino and R. S. Wagers, *J. Appl. Phys.*, Vol. 44, No. 4, p. 1480 (April, 1973), the authors showed that, if it were feasible, a surface acoustic wave device, in which the interdigital electrodes were between a layer of an insulating substrate and a single crystalline layer of piezoelectric material, would be more efficient than surface acoustic wave devices heretofore produced. Calculations for a device comprising ZnO on fused silica and ZnO on $Al_2O_3$ demonstrate that higher efficiency for such devices are obtainable.

SUMMARY OF THE INVENTION

A surface acoustic wave device includes a body of an insulating substrate on which is at least one single crystalline electrode. A single crystalline layer of piezoelectric material is on the electrode.

DETAILED DESCRIPTION OF THE INVENTION

Figure 1:
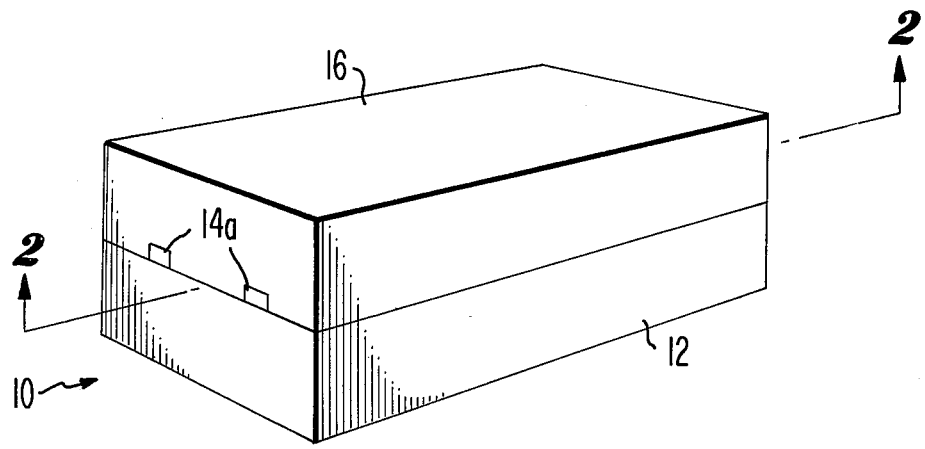
FIG. 1 is a perspective view of a first embodiment of the surface acoustic wave device of the present invention.

Referring initially to FIG. 1, there is shown a first embodiment of the surface acoustic wave device of the present invention, generally designated as 10. The surface acoustic wave device 10 comprises an insulating substrate 12, such as sapphire, spinel, or beryllium oxide (BeO). On one of the surfaces of the substrate 12 are a pair of input electrodes 14a and a pair of output electrodes 14b (shown in FIG. 2). Each pair of electrodes 14a and 14b is shaped in an interdigital grating pattern, and is of an electrically conductive single crystalline material, such as conducting GaN or conducting AlN. A layer 16 of piezoelectric material is on the electrodes 14a and 14b and substrate 12. The layer 16 is also of a single crystalline material, such as insulating GaN or insulating AlN or insulating ZnO.

Figure 2:
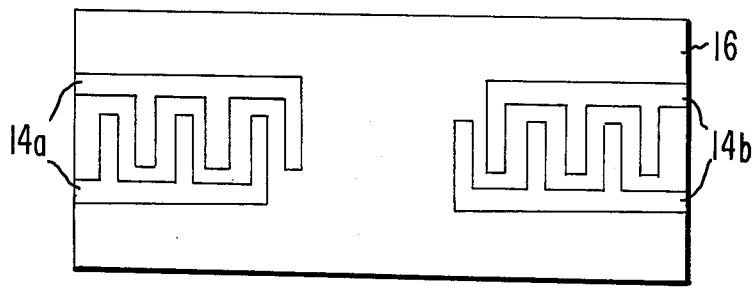
FIG. 2 is a cross-sectional view along plane 2—2 of the first embodiment of the surface acoustic wave device as shown in FIG. 1.

As shown in FIG. 2, the two pairs of electrodes 14a and 14b are each shaped in an interdigital grating pattern. The electrodes 14a and 14b can be formed on substrate 12 by first depositing a layer of conducting GaN or conducting AlN heteroepitaxially on substrate 12. Undoped GaN is a source of conducting GaN; doped AlN is a source of conducting AlN. This layer of GaN or AlN is then etched, resulting in the interdigital grating patterns. The layer of GaN or AlN can be deposited on substrate 12 by any conventional means of crystal growth. For example, the methods as described in the articles entitled "Epitaxial growth and Piezoelectric Properties of AlN, GaN and GaAs on Sapphire or Spinel" by M. T. Duffy, C. C. Wang, G. D. O'Clock Jr., S. H. McFarlane III, and P. J. Zanzucchi published in *Journal of Electronic Materials*, Vol. 2, No. 2 p. 359 (1973), and "The Preparation and Properties of Vapor-Deposited Single Crystalline GaN" by H. P. Maruska and J. J. Tietjen published in *Applied Physics Letters*, Vol. 15, p. 327 (1969) are well suited for this purpose. The layer 16 of piezoelectric material can be formed from insulating GaN. GaN doped with an acceptor, such as Zn, Be, Mg, Al or Li, is a source of insulating GaN. By the methods described in the above articles the layer 16 of insulating GaN is deposited epitaxially on electrodes 14a and 14b and substrate 12. Although the embodiment of the surface acoustic wave device of the present invention as shown in FIG. 1 shows each electrode 14a and 14b as having two interdigits, it is obvious that the number of interdigits of each electrode is not necessarily limited to two. Moreover, it is also obvious that more than one pair of output electrodes 14b may be attached to substrate 12, resulting in a surface acoustic wave device with multiple varied delay outputs.

In the mode of operation, an input electrical signal is converted into a surface acoustic wave by the pair of input electrodes 14a. The delay time of the surface acoustic wave is determined by the layer 16 of piezoelectric material and the substrate 12 where the thickness of the layer 16 is less than about one acoustic wave length. The surface acoustic wave is then converted into an output electrical signal at the pair of output electrodes 14b. Because the input electrodes 14a are "sandwiched" between an insulating substrate 12 and a layer 16 of piezoelectric material, the electric field produced by the input electrical signal will also tend to be confined to these two layers. Thus, unlike the surface acoustic wave devices heretofore produced, in which one surface of the input electrodes is exposed thereby causing loss in the conversion of the input electric signal into a surface acoustic wave; the surface acoustic wave device 10 of the present invention converts more efficiently the input electric energy into a surface acoustic wave. Therefore, a more efficient surface acoustic wave device is created.

Figure 3:
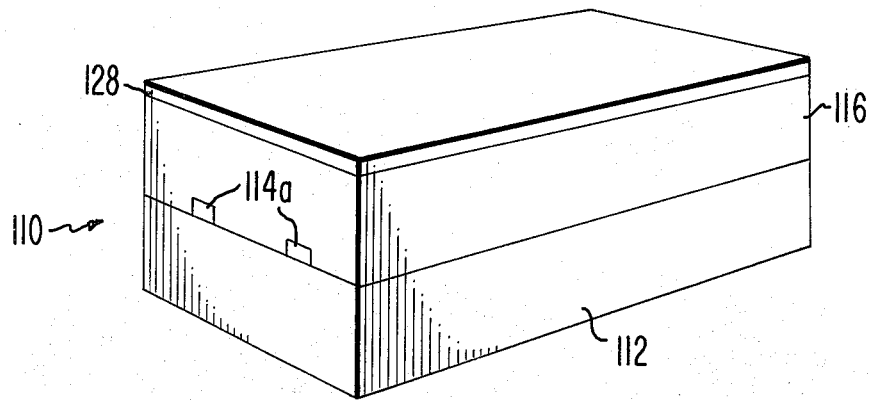
FIG. 3 is a perspective view of a second embodiment of the surface acoustic wave device of the present invention.

Referring to FIG. 3 there is shown a second embodiment of the surface acoustic wave device of the present invention, generally designated as 110. The surface acoustic wave device 110 is similar to the surface acoustic wave device 10 of FIG. 1, except with the addition of a conducting plane on the piezoelectric layer. The surface acoustic wave device 110 comprises an insulating substrate 112 on which are input electrodes and output electrodes similar to the input electrodes 14a and output electrodes 14b of FIG. 1. Only input electrodes 114a are shown. Each pair of input and output electrodes is shaped in an interdigital grating pattern and is of an electrically conductive single crystalline material, such as conducting GaN or conducting AlN. A layer 116 of piezoelectric material is over the input and output electrodes and substrate 112. The layer 116 is also of a single crystalline material, such as insulating GaN or insulating AlN or insulating ZnO. Finally a conductive plane 128, such as a metal film, is on the piezoelectric film 116.

In the mode of operation, an input electrical signal is converted into a surface acoustic wave by the pair of input electrodes 114a. The surface acoustic wave, delayed by the layer 116 of piezoelectric material is converted into an output electrical signal at the pair of output electrodes. The addition of the conducting plane 128 on the layer 116 of piezoelectric material also improves the efficiency of the device. If the layer 116 is thin, without the conducting plane 128 the electric field produced by the input electrical signal will be dispersed through the layer 116 and into the surrounding medium. However, with the addition of the conducting plane 128, the electric field is confined in the layer 116, and dispersion of the electric field into the surrounding medium is kept at a minimum. Thus more efficient conversion of the input electric signal is achieved.

Figure 4:
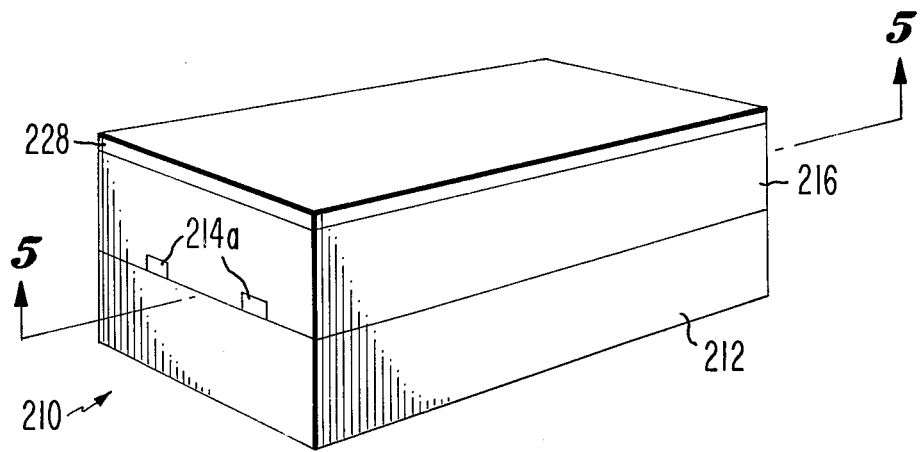
FIG. 4 is a perspective view of a third embodiment of the surface acoustic wave device of the present invention.
Figure 5:
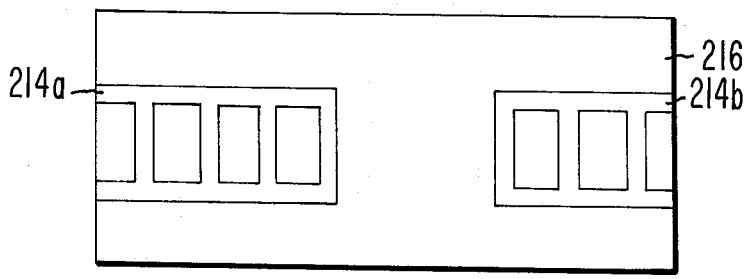
FIG. 5 is a cross-sectional view along plane 5—5 of the third embodiment of the surface acoustic wave device as shown in FIG. 4.

Referring to FIG. 4 there is shown a third embodiment of the surface acoustic wave device of the present invention, generally designated as 210. The surface acoustic wave device 210 is similar to the surface acoustic wave device 110 of FIG. 3, except each electrode is shaped in a single phase grating transducer pattern. The surface acoustic wave device 210 comprises an insulating substrate 212 on which are input electrodes 214a and output electrodes 214b (shown in FIG. 5). Each electrode 214a and 214b is of an electrically conductive single crystalline material, such as conducting GaN or conducting AlN. A layer 216 of piezoelectric material is over the electrodes 214a and 214b and substrate 212. The layer 216 is also of a single crystalline material, such as insulating GaN or insulating AlN or insulating ZnO. Finally, a conducting plane 228, such as a metal film is on the layer 216 of piezoelectric material. A cross-sectional view of the surface acoustic wave device 210 of FIG. 4 along plane 5—5 is shown in FIG. 5. The two electrodes 214a and 214b, each shaped in a single phase grating transducer pattern, are shown.

In the mode of operation, an input electrical signal is converted into a surface acoustic wave by the input electrode 214a and the conducting plane 228. The surface acoustic wave, delayed by the piezoelectric film 216, is converted into an output electrical signal between the output electrode 214b and the conducting plane 228. Since the electric field of the input signal is constrained in the piezoelectric film 216, which lies between the input electrodes 214a and the conducting plane 228, a more efficient conversion of the input signal is achieved.

Figure 6:
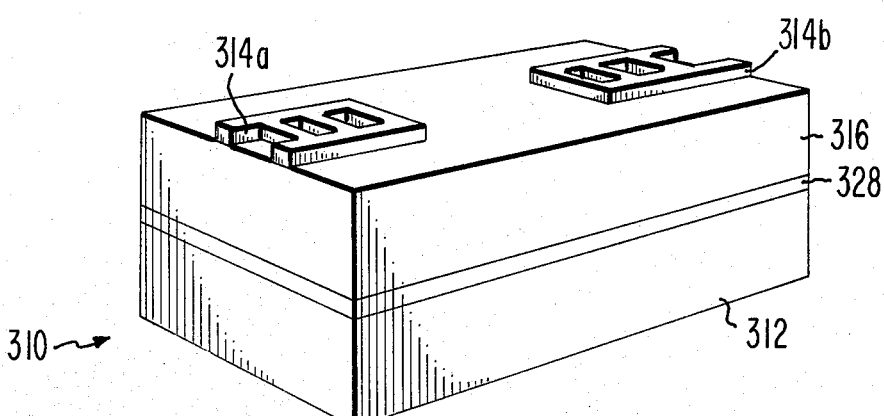
FIG. 6 is a perspective view of a fourth embodiment of the surface acoustic wave device of the present invention.

Referring to Fig. 6, there is shown a fourth embodiment of the surface acoustic wave device of the present invention, generally designated as 310. The surface acoustic wave device 310 is similar to the surface acoustic wave device 210 of FIG. 4, except that the relative positions of the electrodes and the conducting plane are interchanged. The surface acoustic wave device 310 comprises an insulating substrate 312 on which is an electrically conducting plane 328 of a single crystalling material, such as conducting GaN or conducting AlN. A single crystalline layer 316 of piezoelectric material, such as insulating GaN or insulating AlN or insulating ZnO, is on the conducting plane 328. Finally, an input electrode 314a and an output electrode 314b, each shaped in a single phase grating transducer pattern, are on the surface of the single crystalline layer 316 of piezoelectric material. The electrodes 314a and 314b can be formed from any suitable metal.

In the mode of operation, an input electrical signal is converted into a surface acoustic wave by the input electrode 318a and the conducting plane 328. The surface acoustic wave, delayed by the piezoelectric film 316, is converted into an output electrical signal by the output electrode 318b and the conducting plane 328.

What is claimed is:
1. A surface acoustic wave device comprising:
   a. an insulating substrate selected from the group consisting of sapphire, spinel and BeO;
   b. at least two single crystalline electrodes on said substrate; and
   c. a single crystalline piezoelectric film on said electrodes.
2. A surface acoustic wave device in accordance with claim 1 in which said electrodes are of a material selected from the group consisting of conducting GaN and conducting AlN.
3. A surface acoustic wave device in accordance with claim 1 in which at least two pairs of single crystalline electrodes are on said substrate; and
   each of said pair of electrodes is shaped in an interdigital grating pattern.
4. A surface acoustic wave device in accordance with claim 3 including a conducting layer on said piezoelectric film.
5. A surface acoustic wave device in accordance with claim 1 in which;
   each of said single crystalline electrodes is shaped in a single phase grating transducer pattern and;
   an electrically conducting plane, is on said piezoelectric film.
6. A surface acoustic wave device comprising:
   a. an insulating substrate selected from the group consisting of sapphire, spinel and BeO;
   b. at least two single crystalline electrodes selected from the group consisting of conducting GaN and conducting AlN on said substrate; and
   c. a single crystalline piezoelectric film selected from the group consisting of insulating AlN, insulating ZnO, and insulating GaN on said electrode.
7. A surface acoustic wave device comprising;
   a. an insulating substrate selected from the group consisting of sapphire, spinel and BeO;
   b. at least one single crystalline electrically conducting plane, on said substrate;
   c. at least one single crystalline piezoelectric film on said electrically conducting plane; and
   d. at least two electrodes, shaped in grating transducer patterns, on said piezoelectric film.

\* \* \* \* \*